(12) United States Patent
Borst et al.

(10) Patent No.: US 8,932,786 B2
(45) Date of Patent: Jan. 13, 2015

(54) METAL AZO PIGMENTS AND PIGMENT PREPARATIONS PRODUCED THEREFROM

(71) Applicant: LANXESS Deutschland GmbH, Cologne (DE)

(72) Inventors: Hans-Ulrich Borst, Elsdorf (DE); Frank Linke, Cologne (DE); Heinz-Josef Fuellmann, Leichlingen (DE); Stephan Michaelis, Odenthal (DE); Dirk Pfuetzenreuter, Burscheid (DE); Sabine Endert, Wuppertal (DE)

(73) Assignee: LANXESS Deutschland GmbH, Cologne (DE)

( * ) Notice: Subject to any disclaimer, the term of this patent is extended or adjusted under 35 U.S.C. 154(b) by 0 days.

(21) Appl. No.: 13/933,412

(22) Filed: Jul. 2, 2013

(65) Prior Publication Data

US 2014/0016072 A1 Jan. 16, 2014

(30) Foreign Application Priority Data

Jul. 4, 2012 (EP) ..................................... 12174904

(51) Int. Cl.
 *G02B 5/20* (2006.01)
 *G02F 1/1335* (2006.01)
 *G03F 7/004* (2006.01)
 *C09B 45/48* (2006.01)

(52) U.S. Cl.
 USPC .......... 430/7; 430/270.15; 534/602; 534/707; 106/419

(58) Field of Classification Search
 None
 See application file for complete search history.

(56) References Cited

U.S. PATENT DOCUMENTS

| | | | |
|---|---|---|---|
| 3,869,439 | A | 3/1975 | Schundehutte |
| 6,203,604 | B1 | 3/2001 | Kashiwazaki et al. |
| 6,245,138 | B1 | 6/2001 | Nyssen et al. |
| 6,350,307 | B1 | 2/2002 | Linke et al. |
| 6,596,446 | B2 | 7/2003 | Wolf et al. |
| 7,255,737 | B2 | 8/2007 | Feldhues et al. |
| 7,682,444 | B2 | 3/2010 | Feldhues et al. |
| 2002/0034696 | A1* | 3/2002 | Wolf et al. ......................... 430/7 |
| 2002/0111465 | A1 | 8/2002 | Linke et al. |

FOREIGN PATENT DOCUMENTS

| | | |
|---|---|---|
| EP | 0764695 A1 | 3/1997 |
| JP | 11209631 A | 8/1999 |
| JP | 11217514 A | 8/1999 |

OTHER PUBLICATIONS

European Search Report from co-pending Application EP13173412 dated Aug. 30, 2013, 2 pages.

* cited by examiner

*Primary Examiner* — John A. McPherson
(74) *Attorney, Agent, or Firm* — Jennifer R. Seng

(57) ABSTRACT

The new metal azo pigments comprising the adduct of
a) at least two metal azo compounds of the formula (I) or their tautomeric forms

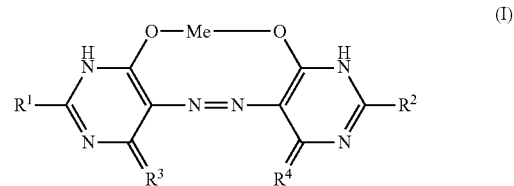

in which the substituents have the definition indicated in the description,
and
b) at least one compound of the formula (II)

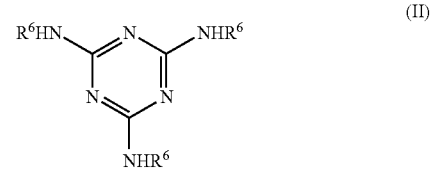

in which
$R^6$ has the definition indicated in the description,
are characterized in that in the X-ray diffractogram with a lattice constant of d=10.3 (±0.2) Å the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02,
and are outstandingly suitable for producing pigment preparations and especially for producing color filters.

15 Claims, No Drawings

METAL AZO PIGMENTS AND PIGMENT PREPARATIONS PRODUCED THEREFROM

The invention relates to new metal azo pigments, to methods for producing them, to pigment preparations comprising these metal azo pigments and also to their use, especially for producing colour filters, and also to the colour filters themselves.

Colour filters are chiefly employed today in liquid crystal displays and screens, colour resolution instruments, and sensors. One known example are the flatscreens on personal computers. There are various techniques for producing the colour filters, which differ not only in the application of the colours but also in the generation of the colour element patterns from the primary colours red, green and blue, in addition to black. The colours may be applied, for example, by colouring a base layer (e.g. gelatine) by means of soluble dyes or pigments ("dye method", "dye dispersion method"), screen printing, offset printing or inkjet printing of pigment pastes, pigment preparations or pigment inks, electrode position of photoresists based on dyes or pigments, and also, in particular, by means of the pigment dispersion technique, where pigments are used which are present in dispersion either in a polyimide resin ("non-photosensitive polyimide method") or in a photoresist ("photosensitive acrylic method"). Associated with the stated methods, both the direct generation of the colour element patterns by printing, and the indirect, photolithographic generation are important, the latter in relation to the aforementioned pigment dispersion technique in particular. The technology of the pigment dispersion technique in the form of the "non-photosensitive polyimide method", for example, is disclosed in JP-A-11-217514 (1998).

In the case of the pigment dispersion technique according to the photoresist method, the colour-imparting pigments are present in fine distribution (dispersed) in a UV-curable photoresist. This photoresist, as well as the pigment, is generally composed of the following components: binder resin, polymerizable monomer, photoinitiator, and optionally a solvent. Preparation takes place, for example, by first finely dispersing the pigment in the form of a concentrate in a solvent and optionally binder resin, and adjusting the dispersion immediately prior to application together with the monomer and the photoinitiator and also, optionally further components. The pigmented photoresist is applied uniformly to the substrate, glass for example, by means of the method known as "spin coating", for example, and is subjected to preliminary drying, UV exposed through a photomask, developed, using a generally inorganic-alkaline solution, to give the desired colour element patterns, and the coating is cleaned and optionally aftercured. This operation is repeated for each colour, i.e. generally 3 times for a trichromitism in the colours red, green and blue, for example.

The advantages associated with the use of pigments in conjunction with the pigment dispersion technique lie in the improved light resistance, moisture resistance and temperature resistance of the colour filters as compared with dye-based coating systems. On the other hand, the transparency and colour purity of coatings based on pigments, irrespective of the coating method, are still not satisfactory. Particularly if different pigments are incorporated in the photoresist in a mixture, in order to shade the mixture to the desired colour locus values, there are unwanted losses in brightness and transparency, with the consequence that operation of the displays or screens (LCDs) unavoidably entails an increased energy cost.

EP-A-947563 describes specific azopyrazolones for use in colour filters. Specific pigments employed in colour filters in accordance with the prior art are disclosed for example in JP-A-11-217514 and JP-A-11-209631, and especially the pigment Colour Index Pigment Yellow 150 in JP-A-11-209632. With regard to the requirements described, however, these pigments are still in need of improvement.

In EP-A-1 146 087, as the yellow component of the green colour, a metal azo pigment is described.

The yellow-green colour component is preferably composed of the CI Pigment Green 36 and/or CI Pigment Green 58 and a yellow metal azo pigment. For enhanced combinability with the other hues, the yellow-green colour component advantageously has very high chromaticity and transparency. For that purpose, the yellow pigment must have maximum chromaticity and transparency. The yellow pigment ought at the same time not itself to be greenish, in order, for example, to allow better blending of Pigment Green 36, which as an individual component is much too green. A small shift in the hue of the yellow pigment in the 'red' direction, and/or an increase in the chroma, implies a dramatic improvement in this yellow pigment as a shading component for, for example, a Pigment Green 36 or 58. In the ideal scenario, moreover, the additive effect of the respective three colour filters (red, green, blue) ought to result in complete light absorption.

EP-A 1 591 489 has already described new pigment preparations with enhanced hue brightness as yellow components. These pigment preparations comprise mixtures of particular metal complexes, preferably 1:1 nickel complex of azobarbituric acid, with small amounts of an iron compound and also at least one further metal compound.

These known pigments and the pigment preparations produced using them are still not satisfactory in terms of all brightness and colour purity requirements relating to the colour filters produced therewith.

New yellow metal azo pigments have been found which are outstandingly suitable for tinting green hues of yellow pigments, for example of CI Pigment Green 36, in pigment preparations in the context of the production of colour filters.

Surprisingly it is possible through the use of the new metal azo pigments as a yellow component in pigment preparations for colour filters to further significantly improve the described coloristic properties of the green hue.

The invention therefore relates to metal azo pigments comprising the adduct of a) at least two metal azo compounds of the formula (I) or tautomeric forms thereof

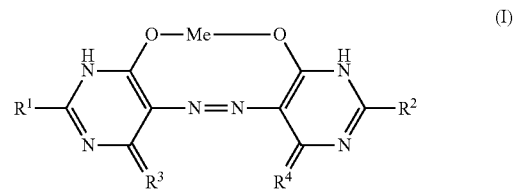

in which $R^1$ and $R^2$ independently of one another are OH, $NH_2$, or $NHR^5$, $R^3$ and $R^4$ independently of one another are =O or =$NR^5$, $R^5$ is hydrogen or alkyl, and Me is a divalent or trivalent metal ion selected from the series $Ni^{2+}$, $Zn^{2+}$, $Cu^{2+}$, $Al^{3+}_{2/3}$, $Fe^{2+}$, $Fe^{3+}_{2/3}$, $Co^{2+}$ and $Co^{3+}_{2/3}$, with the proviso that the amount of metal ions from the series $Zn^{2+}$ and $Ni^{2+}$ is 95 to 100 mol % and the amount of metal ions selected from the series $Cu^{2+}$, $Al^{3+}{}_{2/3}$, $Fe^{2+}$, $Fe^{3+}{}_{2/3}$, $Co^{2+}$ and $Co^{3+}{}_{2/3}$ is 0 to 5 mol %, based in each case on one mole of all of the compounds of the formula (I), and where the molar ratio of Zn to Ni metal ions in the sum total of the compounds of the formula (I) is 9:1 to 1:9, and b) at least one compound of the formula (II)

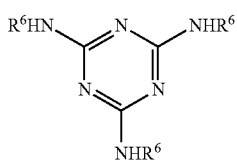
(II)

in which $R^6$ is hydrogen or alkyl, characterized in that in the X-ray diffractogram with a lattice constant of d=10.3 (±0.2) Å the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

Preference is given to metal azo pigments comprising the adduct of a) at least two metal azo compounds of the formula (I) or tautomeric forms thereof (I)

in which $R^1$ and $R^2$ independently of one another are OH, $NH_2$ or $NHR^5$, $R^3$ and $R^4$ independently of one another are =O or =$NR^5$, $R^5$ is hydrogen or $C_1$-$C_4$-alkyl, and Me is a divalent or trivalent metal ion selected from the series $Ni^{2+}$, $Zn^{2+}$, $Cu^{2+}$, $Al^{3+}{}_{2/3}$, $Fe^{2+}$, $Fe^{3+}{}_{2/3}$, $Co^{2+}$ and $Co^{3+}{}_{2/3}$, with the proviso that the amount of metal ions from the series $Zn^{2+}$ and $Ni^{2+}$ is 95 to 100 mol % and the amount of metal ions selected from the series $Cu^{2+}$, $Al^{3+}{}_{2/3}$, $Fe^{2+}$, $Fe^{3+}{}_{2/3}$, $Co^{2+}$ and $Co^{3+}{}_{2/3}$ is 0 to 5 mol %, based in each case on one mole of all of the compounds of the formula (I), and where the molar ratio of Zn to Ni metal ions in the sum total of the compounds of the formula (I) is 9:1 to 1:9, and b) at least one compound of the formula (II)

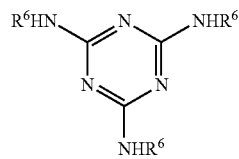
(II)

in which $R^6$ is hydrogen or $C_1$-$C_4$-alkyl which is optionally substituted by one or more OH groups, characterized in that in the X-ray diffractogram with a lattice constant of d=10.3 (±0.2) Å the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

Especial preference is given to metal azo pigments comprising the adduct of a) a metal azo compound of the formula (Ia) or one of its tautomeric forms (Ia)

in which $R^1$ and $R^2$ independently of one another are OH, $NH_2$ or $NHR^5$, $R^3$ and $R^4$ independently of one another are =O or =$NR^5$, $R^5$ is hydrogen or $C_1$-$C_4$-alkyl, and a metal azo compound of the formula (Ib) or one of its tautomeric forms

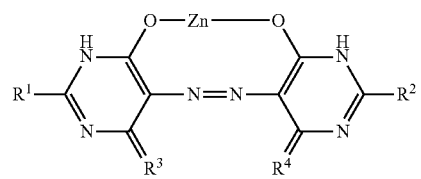
(Ib)

in which $R^1$ and $R^2$ independently of one another are OH, $NH_2$ or $NHR^5$, $R^3$ and $R^4$ independently of one another are =O or =$NR^5$, and $R^5$ is hydrogen or $C_1$-$C_4$-alkyl, and optionally a compound of the formula (Ic)

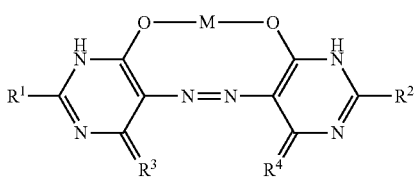

in which
R¹ and R² independently of one another are OH, NH₂ or NHR⁵,
R³ and R⁴ independently of one another are =O or =NR⁵, and
R⁵ is hydrogen or $C_1$-$C_4$-alkyl, and
M is a divalent or trivalent metal ion selected from the series $Cu^{2+}$, $Al^{3+}_{2/3}$, $Fe^{2+}$, $Fe^{3+}_{2/3}$, $Co^{2+}$ and $Co^{3+}_{2/3}$,
with the proviso that the amount of metal ions from the series $Zn^{2+}$ and $Ni^{2+}$ is 95 to 100 mol % and the amount of metal ions selected from the series $Cu^{2+}$, $Al^{3+}_{2/3}$, $Fe^{2+}$, $Fe^{3+}_{2/3}$, $Co^{2+}$ and $Co^{3+}_{2/3}$ is 0 to 5 mol %, based in each case on one mole of all of the compounds of the formula (I),
where the molar ratio of Zn to Ni metal ions in the sum total of the compounds of the formulae (Ia) and (Ib) is 9:1 to 1:9, and
b) at least one compound of the formula (II)

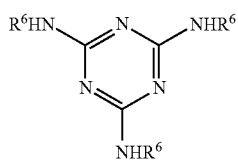
(II)

in which
R⁶ is hydrogen or $C_1$-$C_4$-alkyl which is optionally substituted by one or more OH groups,
characterized in that in the X-ray diffractogram with a lattice constant of d=10.3 (±0.2) Å the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

More particular preference is given to metal azo pigments comprising the adduct of
a) a metal azo compound of the formula (Ia) or one of its tautomeric forms

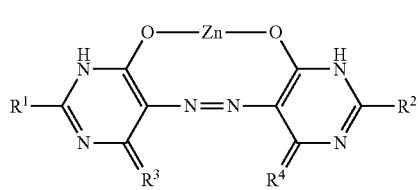
(Ia)

in which
R¹ and R² independently of one another are OH, NH₂ or NHR⁵,
R³ and R⁴ independently of one another are =O or =NR⁵,
R⁵ is hydrogen or $C_1$-$C_4$-alkyl, and a metal azo compound of the formula (Ib) or one of its tautomeric forms

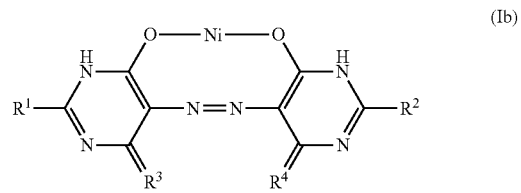
(Ib)

in which
R¹ and R² independently of one another are OH, NH₂ or NHR⁵,
R³ and R⁴ independently of one another are =O or =NR⁵, and
R⁵ is hydrogen or $C_1$-$C_4$-alkyl,
with the proviso that the amount of metal ions from the series $Zn^{2+}$ and $Ni^{2+}$ is 100 mol %, based on one mole of all of the compounds (Ia) and (Ib),
where the molar ratio of Zn to Ni metal ions in the sum total of the compounds of the formulae (Ia) and (Ib) is 9:1 to 1:9,
and
b) at least one compound of the formula (II)

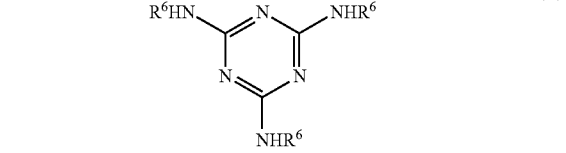
(II)

in which
R⁶ is hydrogen or $C_1$-$C_4$-alkyl which is optionally substituted by one or more OH groups,
characterized in that in the X-ray diffractogram with a lattice constant of d=103 (±0.2) Å the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

Furthermore, more particular preference is given to metal azo pigments comprising the adduct of
a) a metal azo compound of the formula (Ia) or one of its tautomeric forms

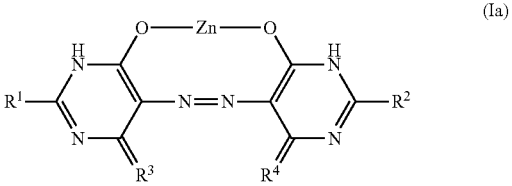
(Ia)

in which
R¹ and R² are OH,
R³ and R⁴ are =O,
and
a metal azo compound of the formula (Ib) or one of its tautomeric forms

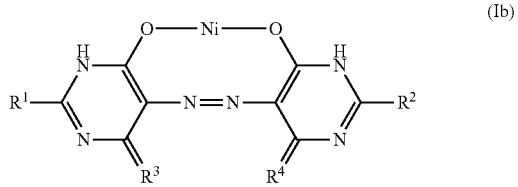

(Ib)

in which
R¹ and R² are OH,
R³ and R⁴ are =O,
with the proviso that the amount of metal ions from the series Zn and Ni is 100 mol %, based on one mole of compounds (Ia) and (Ib),
where the molar ratio of Zn to Ni metal ions in the sum total of the compounds of the formulae (Ia) and (Ib) is 9:1 to 1:9,
and
b) at least one compound of the formula (II)

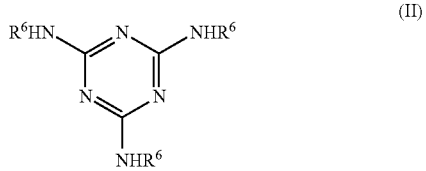

(II)

in which
R⁶ is hydrogen,
characterized in that in the X-ray diffractogram with a lattice constant of d=10.3 (±0.2) Å the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

In contrast to a physical mixture of the pure Ni azo compound and the pure Zn azo compound conforming to the above-indicated structures of the formulae (Ia) and (Ib), the metal azo compounds of the formula (I) that are present in the metal azo pigments of the invention comprise chemical hybrid compounds in which the Ni and Zn atoms, and also, optionally, further metal ions M, are incorporated in a common crystal lattice. This difference can be shown experimentally through the different X-ray diffractograms for the physical mixtures and for the chemical hybrid compounds. Thus, for example, the X-ray diffractograms of the chemical hybrid compounds of the metal azo pigments of the invention comprising in each case the adduct of the Ni/Zn azo compound and melamine, according to Examples 3 to 5, differ characteristically from the X-ray diffractograms of the physical mixtures of the individual pigments, as is clear from a comparison of the measurement values in Tables 3 to 5 with the measurement values in Tables 6 to 8.

Substituents in the definition of alkyl denote, for example, straight-chain or branched $C_1$-$C_6$-alkyl, which optionally may be substituted one or more times by identical or different substituents, for example by halogen, such as chlorine, bromine or fluorine; —OH, —CN, —NH₂ or $C_1$-$C_6$-alkoxy.

The metal azo pigments of the invention are adducts of a) metal azo compounds of the formula (I) with b) compounds of the formula (II). Adducts here are generally composite molecules. The bond between the molecules may be made for example by intermolecular interactions or Lewis acid-base interactions or by coordinative bonds. The term "adduct" is therefore intended for the purposes of the present invention to encompass, generally, all kinds of incorporation and addition compounds.

The terms "incorporation compound" or "addition compound" in the sense of the present invention are intended to mean, for example, compounds which are formed on the basis of intermolecular interactions such as Van der Waals interactions or else Lewis acid-base interactions. How the incorporation proceeds is dependent not only on the chemical properties of the component to be incorporated but also on the chemical nature of the host lattice. Such compounds are frequently also referred to as intercalation compounds. Chemically speaking, this refers to the incorporation of molecules, ions (rarely also atoms) into chemical compounds.

The term is also to be understood to refer to inclusion compounds, known as clathrates. These are two-substance compounds in which a guest molecule is incorporated in a lattice or cage comprising a host molecule.

The terms "incorporation compound" or "addition compound" in the sense of the present invention are also to be understood to refer to mixed incorporation crystals (or interstitial compounds). Such a compound is a chemical, non-stoichiometric, crystalline compound of at least two elements.

Furthermore, the terms "incorporation compound" or "addition compound" are also to be understood in the sense of the present invention to refer to compounds which are formed on the basis of coordinative bonds or complex-type bonds. Examples of such compounds include mixed substitution crystal or mixed replacement crystal, in which at least two substances form a joint crystal and in which the atoms of the second component are located at regular lattice positions of the first component.

Compounds which are able to form an incorporation compound or addition compound with the compound of the formula (I) may be both organic compounds and inorganic compounds. In the text below, these compounds are identified as incorporation/addition compounds.

Incorporation/addition compounds that are suitable in principle come from a very wide variety of different classes of compound. For purely practical reasons, preferred compounds are those which are solid or liquid under standard conditions (25° C., 1 bar).

Of the liquid substances, preference is generally given to those which have a boiling point of 100° C. or more, preferably of greater than or equal to 150° C. at 1 bar. Suitable incorporation/addition compounds are, generally, acyclic and cyclic organic compounds, examples being aliphatic and aromatic hydrocarbons, which may be substituted, for example by OH, COOH, NH₂, substituted NH₂, CONH₂, substituted CONH₂, SO₂NH₂, substituted SO₂NH₂, SO₃H, halogen, NO₂, CN, —SO₂-alkyl, —SO₂-aryl, —O-alkyl, —O-aryl, —O-acyl.

Carboxamides and sulphonamides are one preferred group of incorporation/addition compounds, and also suitable in particular are urea and substituted ureas such as phenylurea, dodecylurea and others, and also polycondensates thereof with aldehydes, more particular formaldehyde; heterocycles such as barbituric acid, benzimidazolone, benzimidazolone-5-sulphonic acid, 2,3-dihydroxyquinoxaline, 2,3-dihydroxyquinoxaline-6-sulphonic acid, carbazole, carbazole-3,6-disulphonic acid, 2-hydroxyquinoline, 2,4-dihydroxyquinoline, caprolactam, melamine, 6-phenyl-1,3,5-triazine-2,4-diamine, 6-methyl-1,3,5-triazine-2,4-diamine, cyanuric acid.

Used in accordance with the invention as incorporation/ addition compound are those of the formula (II). Especially preferred in this context is melamine.

Likewise suitable in principle as incorporation/addition compounds are polymers, preferably water-soluble polymers, examples being ethylene-propylene oxide block polymers, preferably having a $M_n$ of greater than or equal to 1000, more particularly of 1000 to 10 000 g/mol, polyvinyl alcohol, poly(meth)acrylic acids, modified cellulose, such as carboxymethylcelluloses, hydroxy-ethyl- and -propylcelluloses, methyl- and ethylhydroxyethylcelluloses. The amount of compound of the formula (II) forming an adduct with the metal azo compounds of the formula (I) is generally 5% to 300 mol %, preferably 10 to 250 mol % and more particularly 100 to 200 mol %, based in each case on one mole of compound of the formula (I). The metal azo pigment of the invention preferably possesses a specific surface area ($m^2$/g) of 50 to 200 $m^2$/g, more particularly 80 to 160 $m^2$/g, very preferably 100 to 150 $m^2$/g. The surface area is determined in accordance with DIN 66131: Determination of the specific surface area of solids by gas adsorption by the method of Brunauer, Emmett and Teller (B.E.T.). With particular preference the metal azo pigment of the invention consists of the adduct of a) at least two metal azo compounds of the formula (I) and b) at least one compound of the formula (II), in each case in their general and preferred definitions.

The metal azo pigments of the invention are obtainable by reacting compounds of the formula (I) or their tautomeric form of their alkali metal salts, preferably of their sodium or potassium salts, in the presence of at least one compound of the formula (II) with nickel salts and zinc salts and optionally with one or more metal salts from the series of copper, aluminium, iron and cobalt salts.

The present invention further provides a method for producing the metal azo pigments of the invention, which is characterized in that a compound of the formula (Id), or tautomers thereof,

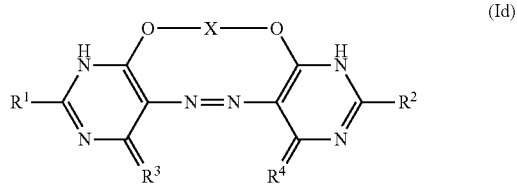

(Id)

in which
X is an alkali metal ion, preferably a sodium or potassium ion,
$R^1$ and $R^2$ independently of one another are OH, $NH_2$ or $NHR^5$,
$R^3$ and $R^4$ independently of one another are =O or =$NR^5$,
$R^5$ is hydrogen or alkyl,
is or are reacted in the presence of at least one compound of the formula (II) with at least one nickel salt and at least one zinc salt and optionally with at least one further metal salt from the series of copper, aluminium, iron and cobalt salts.

The method of the invention is carried out using generally, per mole of compound of the formula (Id), 0.05 to 0.9 mol of at least one nickel salt, 0.05 to 0.9 mol of at least one zinc salt and 0.05 to 0 mol of at least one metal salt from the series of copper, aluminium, iron and cobalt salts.

Per mole of compound of the formula (Id), preference is given to using 0.2 to 0.8 mol of at least one nickel salt, 0.1 to 0.75 mol of at least one zinc salt and 0.05 to 0 mol of at least one metal salt from the series of copper, aluminium, iron and cobalt salts.

Per mole of compound of the formula (Id), very particular preference is given to using 0.4 to 0.6 mol of at least one nickel salt, 0.2 to 0.6 mol of at least one zinc salt and 0 to 0.05 mol of at least one metal salt from the series of copper, aluminium, iron and cobalt salts.

Generally speaking, the method of the invention is carried out using, per mole of compound of the formula (Id) 0.05 to 4 mol, preferably 0.5 to 2.5 mol and very preferably 1.0 to 2.0 mol of compound of the formula (II).

Especially preferred is the preparation of binary zinc/nickel azo barbituric acid-melamine adducts. Employed for this purpose, per mole of compound of the formula (Id), are 0.05-0.95 mol, preferably 0.2-0.8 mol and very preferably 0.4-0.7 mol of at least one nickel salt and 0.05-0.95 mol, preferably 0.15-0.6 mol and very preferably 0.25-0.45 mol of at least one zinc salt and 0.05-4 mol, preferably 0.5-2.5 and more preferably 1-2 mol of at least one compound of the formula (II).

The method of the invention is carried out in general at a temperature from 60 to 95° C. in aqueous solution at a pH below 7. The nickel and zinc salts for use in accordance with the invention and the further metal salts for optional use, from the series of copper, aluminium, iron and cobalt salts, may be used individually or as a mixture with one another, preferably in the form of an aqueous solution. The compounds of the formula (II) may likewise be added individually or as a mixture with one another, preferably in the form of solids.

In general the method of the invention is carried out such that the azo compound of the formula (Id), preferably as Na or K salt, is introduced initially, one or more of the compound or compounds of the formula (II) that are to be incorporated or added, preferably melamine, is or are added, and this charge is thereafter reacted with at least one nickel salt and at least one zinc salt and optionally one or more metal salts from the series of copper, aluminium, iron and cobalt salts, preferably in the form of the aqueous solutions of these salts, preferably at pH levels of less than 7. Suitability for the purpose of adjusting the pH is possessed by aqueous sodium hydroxide solution, aqueous potassium hydroxide solution, sodium carbonate, sodium hydrogen carbonate, potassium carbonate and potassium hydrogen carbonate.

Suitable nickel salts and zinc salts are preferably their water-soluble salts, more particularly chlorides, bromides, acetates, formates, nitrates, sulphates, etc. Nickel and zinc salts employed with preference possess a water solubility of more than 20 g/l, more particularly more than 50 g/l at 20° C.

Suitable further metal salts from the series of copper, aluminium, iron and cobalt salts are preferably their water-soluble salts, more particularly their chlorides, bromides, acetates, nitrates and sulphates, preferably their chlorides.

The metal azo pigments of the invention that are obtained in this way can then be isolated in the form of an aqueous suction filtercake by filtration of their aqueous suspension. This filtercake can be dried by customary drying methods after washing with hot water, for example.

Examples of suitable drying methods include the paddle drying or the spray drying of corresponding aqueous slurries.

The pigment may subsequently be ground.

Where the metal azo pigments of the invention are too harsh-grained or too hard for dispersing, for the desired application, they may be converted to soft-grain pigments in accordance, for example, with the technique described in DE-A 19 847 586.

The present invention additionally provides pigment preparations comprising at least one metal azo pigment of the invention. The pigment preparations of the invention are preferably solid at room temperature. Besides the metal azo pigment of the invention they may comprise further additions.

Further additions are, for example, dispersants, carboxamides and sulphonamides, and additions customary for pigment preparation.

A dispersant for the purposes of this specification is a substance which stabilizes the pigment particles in their fine particulate form in aqueous media. By fine particulate is meant preferably a finely divided state of 0.001 to 5 µm, more particularly of 0.005 to 1 µm, very preferably of 0.005 to 0.5 µm. The preparation of the invention is preferably in finely particulate form.

Suitable dispersants are, for example, anionic, cationic, amphoteric or nonionic.

The dispersant is used preferably in an amount of 0.1 to 100 wt %, more particularly 0.5 to 60 wt %, based on the metal azo pigment of the invention that is used, in the pigment preparation.

The preparation of the invention may of course also comprise further additions. Thus, for example, the additions which lower the viscosity of an aqueous suspension and raise the solids content, such as carboxamides and sulphonamides, may be added in an amount of up to 10 wt %, based on the preparation.

Additionally preferred, therefore, are the pigment preparations of the invention comprising at least one dispersant as well as the metal azo pigment of the invention.

The pigment preparations are preferably solid preparations which are present preferably as powders or granules.

The metal azo pigments of the invention are notable for particularly good dispersibility and high colour strength. Chroma and transparency are outstandingly adjustable.

The pigment preparations of the invention are outstandingly suitable for all pigment utilities.

For example they are suitable for pigmenting varnishes of all kinds for the production of printing colours, distemper colours or binder colours, for the mass colouring of paper, for the mass colouring of synthetic, semi-synthetic or natural macromolecular substances, such as polyvinyl chloride, polystyrene, polyamide, polyethylene or polypropylene, for example. They can also be used for the solution colouring of natural, regenerated or manmade fibres, such as cellulosic, polyester, polycarbonate, polyacrylonitrile or polyamide fibres, for example, and also for the printing of textiles and paper. From these pigments it is possible to produce finely divided, stable, aqueous pigmentations of emulsion paints and coating colours that can be used for paper colouring, for the pigment printing of textiles, for laminate printing or for the solution colouring of viscose, by grinding or kneading in the presence of nonionic, anionic or cationic surfactants.

The pigments are outstandingly suitable for ink jet applications and for colour filters for liquid crystal displays.

Particularly preferred pigment preparations of the invention are those comprising at least one metal azo pigment of the invention and c) an organic compound selected from the group of terpenes, terpenoids, fatty acids, fatty acid esters and homopolymers or copolymers, such as random or block copolymers having a solubility in pH-neutral water at 20° C. of less than 1 g/l, more particularly less than 0.1 g/l.

Particularly preferred are these pigment preparations of the invention in solid form, preferably in the form of powder or granules.

The organic compound of component (c) is preferably solid or liquid at room temperature (20° C.) in a standard atmosphere, and, if it is liquid, it has a boiling point of preferably >100° C., more particularly >150° C.

Preferred polymers possess both a hydrophilic and a hydrophobic, preferably polymeric, moiety to the molecule. Examples of such polymers are random copolymers based on fatty acids or long-chain $C_{12}$-$C_{22}$ hydrocarbons and polyalkylene glycols, more particularly polyethylene glycol. Furthermore, block copolymers based on (poly)hydroxy fatty acids and polyalkylene glycol, more particularly polyethylene glycol, and also graft copolymers based on poly(meth)acrylate and polyalkylene glycol, more particularly polyethylene glycol.

Preferred compounds from the group of terpenes, terpenoids, fatty acids and fatty acid esters include the following: ocimene, myrcene, geraniol, nerol, linalool, citronellol, geranial, citronellal, neral, limonene, menthol, for example (–)-menthol, menthone or bicyclic monoterpenes, saturated and unsaturated fatty acids having 6 to 22 C atoms, such as, for example, oleic acid, linoleic acid and linolenic acid or mixtures thereof.

Also suitable, furthermore, as organic compounds of component (c) are those given above as incorporation/addition compounds, provided that they conform to the criteria desired for the compound of component c).

Where the compound to be incorporated or added and the compound of component c) are identical, differentiation is achieved via the capacity for the compound c) to be leached with a suitable solvent. Particularly preferred pigment preparations comprise:

50-99 wt % of at least one metal azo pigment of the invention and 1-50 wt %, preferably 2 to 50 wt %, of at least one compound of component c).

The pigment preparation of the invention optionally further comprises a surface-active agent e).

Suitable surface-active agents e) are, for example, anionic, cationic, amphoteric or nonionic in nature.

Suitable anionic surface-active agents are, in particular, condensation products of aromatic sulphonic acids with formaldehyde, such as condensation products of formaldehyde and alkylnaphthalenesulphonic acids or of formaldehyde, naphthalenesulphonic acids and/or benzenesulphonic acids, condensation products of optionally substituted phenol with formaldehyde and sodium bisulphite. Also suitable are surface-active agents from the group of sulphosuccinic esters and also alkylbenzenesulphonates. Furthermore, ionically modified, more particularly sulphated or carboxylated, alkoxylated fatty acid alcohols or salts thereof. Alkoxylated fatty acid alcohols are more particularly those saturated or unsaturated $C_6$-$C_{22}$ fatty acid alcohols having 5 to 120, preferably 5 to 60, more particularly having 5 to 30 ethylene oxide. Contemplated in particular, furthermore, are lignosulphonates, examples being those obtained by the sulphite or kraft process. The products in question are preferably products which are partly hydrolysed, oxidized, propoxylated, sulphonated, sulphomethylated or desulphonated and are fractionated according to known processes, as for example according to the molecular weight or according to the degree of sulphonation. Mixtures of sulphide and kraft lignosulphonates are also highly effective. Particularly suitable lignosulphonates are those having an average molecular weight of between 1000 and 100 000 g/mol, an active lignosulphonate content of at least 80 wt % and preferably a low polyvalent cation content. The degree of sulphonation may vary within wide limits.

Examples of suitable nonionic surface-active agents include the following: reaction products of alkylene oxides with alkylatable compounds, such as, for example, fatty alcohols, fatty amines, fatty acids, phenols, alkylphenols, arylalkylphenols, such as styrene-phenol condensates, carboxamides and resin acids. These are, for example, ethylene oxide adducts from the class of reaction products of ethylene oxide with:

a1) saturated and/or unsaturated fatty alcohols having 6 to 22 C atoms or b1) alkylphenols having 4 to 12 C atoms in the alkyl radical or c1) saturated and/or unsaturated fatty amines having 14 to 20 C atoms or d1) saturated and/or unsaturated fatty acids having 14 to 20 C atoms or e1) hydrogenated and/or non-hydrogenated resin acids.

Suitable ethylene oxide adducts are especially the alkylatable compounds identified under a1) to e1) with 5 to 120, more particularly 5 to 100, more particularly 5 to 60, very preferably 5 to 30 mol of ethylene oxide.

Likewise suitable as surface-active agents are the esters of the alkoxylation product of the formula (X) that are known from DE-A 19 712 486 or from DE-A 19 535 246 and which correspond to the formula (XI), and also these esters optionally in a mixture with the parent compounds of the formula (X). The alkoxylation product of a styrene-phenol condensate of the formula (X) is defined as below:

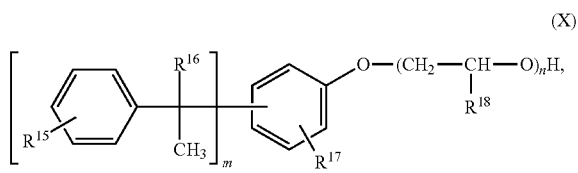

(X)

in which $R^{15}$ is hydrogen or $C_1$-$C_4$-alkyl, $R^{16}$ is hydrogen or $CH_3$, $R^{17}$ is hydrogen, $C_1$-$C_4$-alkyl, $C_1$-$C_4$-alkoxy, $C_1$-$C_4$-alkoxycarbonyl or phenyl, m is a number from 1 to 4, n is a number from 6 to 120, $R^{18}$ is identical or different for each unit indicated by n, and is hydrogen, $CH_3$ or phenyl, and, in the case where $CH_3$ is also present in the various —($-CH_2$—$CH(R^{18})$—O—)— groups, $R^{18}$ is $CH_3$ in 0 to 60% of the total value of n and $R^{18}$ is hydrogen in 100 to 40% of the total value of n, and, where phenyl is also present in the various —($-CH_2$—$CH(R^{18})$—O—)— groups, $R^{18}$ is phenyl in 0 to 40% of the total value of n and $R^{18}$ is hydrogen in 100 to 60% of the total value of n.

The esters of the alkoxylation products (X) correspond to the formula (XI)

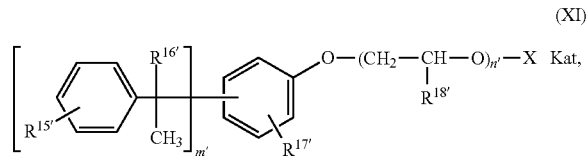

(XI)

in which $R^{15'}$, $R^{16'}$, $R^{17'}$, $R^{18'}$, m' and n' adopt the extent of the definition of $R^{15}$, $R^{16}$, $R^{17}$, $R^{18}$, m and n respectively, but independently thereof, X is the group —$SO_3$, —$SO_2$, —$PO_3$ or —CO—($R^{19}$)—COO, Kat is a cation from the group of H, Li, Na, K, $NH_4$ or HO—$CH_2CH_2$—$NH_3$, and in the case of X=—$PO_3$ there are two Kats, and $R^{19}$ is a divalent aliphatic or aromatic radical, preferably $C_1$-$C_4$-alkylene, more particularly ethylene, $C_2$-$C_4$ monounsaturated radicals, more particularly acetylene, or optionally substituted phenylene, more particularly ortho-phenylene, with possible substituents suitably being preferably $C_1$-$C_4$-alkyl, $C_1$-$C_4$-alkoxy, $C_1$-$C_4$-alkoxycarbonyl or phenyl.

A preferred surface-active agent used is the compound of the formula (XI). A preferred compound of the formula (XI) is a compound in which X is a radical of the formula —CO—($R^{19}$)—COO⁻ and $R^{19}$ possess the above definition.

Likewise used with preference as surface-active agent is a compound of the formula (XI) together with a compound of the formula (X). In this case the surface-active agent preferably comprises 5 to 99 wt % of the compound (XI) and 1 to 95 wt % of the compound (X).

The surface-active agent of component e) is used preferably in an amount of 0.1 to 100 wt %, more particularly 0.5 to 60 wt %, based on the pigment employed.

The pigment preparation of the invention may of course also comprise further additions. Thus, for example, viscosity-lowering or solids-enhancing additions may be introduced in the course of the production of aqueous suspensions, in an amount of up to 10 wt %, based on the preparation.

Examples of further additions are organic and inorganic bases and also additions customary for pigment preparation.

Bases include the following: alkali metal hydroxides, such as, for example, NaOH, KOH or organic amines such as alkylamines, more particularly alkanolamines or alkylalkanolamines.

Those particularly preferred include methylamine, dimethylamine, trimethylamine, ethanolamine, n-propanolamine, n-butanolamine, diethanolamine, triethanolamine, methylethanolamine or dimethylethanolamine.

Examples of suitable carboxamides and sulphonamides are as follows: urea and substituted ureas such as phenylurea, dodecylurea and others; heterocycles such as barbituric acid, benzimidazolone, benzimidazolone-5-sulphonic acid, 2,3-dihydroxyquinoxaline, 2,3-dihydroxyquinoxaline-6-sulphonic acid, carbazole, carbazole-3,6-disulphonic acid, 2-hydroxyquinoline, 2,4-dihydroxy-quinoline, caprolactam, melamine, 6-phenyl-1,3,5-triazine-2,4-diamine, 6-methyl-1,3,5-triazine-2,4-diamine, cyanuric acid.

The base is optionally present in an amount of up to 20 wt %, preferably up to 10 wt %, based on the pigment.

As a result of their preparation, furthermore, the pigment preparations of the invention may also comprise organic and/or inorganic salts.

With particular preference the preparations of the invention consist to an extent of more than 90 wt %, preferably more than 95 wt % and more particularly more than 97 wt % of at least one metal azo pigment of the invention, at least one organic compound of component c) and optionally at least one surface-active agent of component e), and optionally at least one base.

The present invention additionally provides a method for producing the pigment preparations of the invention that is characterized in that at least one metal azo pigment of the invention, at least one organic compound of component c)

and optionally at least one surface-active agent of component e), and optionally at least one base, are mixed with one another.

Likewise provided with the present invention is the use of the metal azo pigments of the invention or of the pigment preparations of the invention for producing colour filters for liquid crystal displays. This use may be described below, using as an example the pigment dispersion technique according to the photoresist method.

The inventive use of the pigment preparations of the invention for producing colour filters is characterized, for example, in that at least one metal azo pigment of the invention or one pigment preparation of the invention, more particularly a solid pigment preparation, is homogenized optionally with a binder resin and an organic solvent, optionally with addition of a dispersant, and is then subjected, continuously or batchwise, to wet comminution to a particle size by number (determined by electron microscopy) of 99.5%<1000 nm, preferably 95%<500 nm and more particularly 90%<200 nm.

Examples of suitable wet comminution methods include stirrer or dissolver dispersing, grinding by means of stirred ball mills or bead mills, compounders, roll mills, high-pressure homogenization or ultrasound dispersing.

During the dispersing treatment or thereafter, at least one photocurable monomer and one photoinitiator are added. Following the dispersing it is also possible for further binder resin, solvent, or adjuvants customary for photoresists to be introduced, as required for the desired photosensitive coating material formulation (photoresist) for producing the colour filters. For the purposes of this invention, a photoresist is a preparation which comprises at least one photocurable monomer and a photoinitiator.

The present invention also provides a method for producing colour filters for liquid crystal displays, which is characterized in that at least one metal azo pigment of the invention or a pigment preparation of the invention, optionally with a binder resin and an organic solvent, is homogenized, optionally with addition of a dispersant, and is subsequently subjected, continuously or batchwise, to wet comminution to a particle size by number (determined electron microscopy) at 99.5%<1000 nm, and during the dispersing treatment or thereafter at least one photocurable monomer and a photoinitiator are added.

Possible dispersants contemplated include, generally, commercial dispersants such as, for example, polymeric, ionic or nonionic dispersants based for example on polycarboxylic acids or polysulphonic acids, and also polyethylene oxide-polypropylene oxide block copolymers. Furthermore, derivatives of organic dyes may also be used as dispersants or co-dispersants.

In the production of the colour filters, therefore, "formulations" are obtained which based on the formulation comprise:
at least one metal azo pigment of the invention,
optionally a binder resin,
at least one organic solvent and
optionally a dispersant.

In one preferred embodiment the formulation comprises (figures based on formulation):

| | |
|---|---|
| 1-50 wt % | of a metal azo pigment of the invention |
| 0-20 wt % | of binder resin |
| 0-20 wt % | of dispersant |
| 10-94 wt % | of organic solvent |

The coating of the photoresist onto a plate for the purpose of generating the coloured image element patterns may be accomplished by either direct or indirect application. Examples of application techniques that may be mentioned include the following: roller coating, spin coating, spray coating, dip coating and air knife coating.

Examples of suitable plates, depending on use, include the following: transparent glasses such as white or blue glass plate, silicate-coated blue glass plate, synthetic-resin plate or synthetic-resin films based for example on polyester resin, polycarbonate resin, acrylic resin or vinyl chloride resin, and also metal plates based on aluminium, copper, nickel or steel, and also ceramic plates or semiconductor plates with applied photoelectric transfer elements.

Application generally takes place in such a way that the coat thickness of the photosensitive coat obtained is 0.1 to 10 µm.

The application may be followed by thermal drying of the coat.

Exposure is preferably accomplished by exposing the photosensitive coat to an active light beam, preferably in the form of an image pattern, using a photomask. This cures the coat at the locations exposed. Examples of suitable light sources include the following: high-pressure and ultra-high-pressure mercury vapour lamp, xenon lamp, metal halide lamp, fluorescent lamp, and also laser beam in the visible range.

The development subsequent to exposure removes the unexposed portion of the coating, giving the desired image pattern form of the colour elements. Typical development techniques include spraying with or immersing in aqueous alkaline developer solution or in an organic solvent that comprises inorganic alkali such as sodium or potassium hydroxide, for example, sodium metasilicate or organic bases such as monoethanolamine, diethanolamine, triethanolamine, triethylamine or salts thereof.

Development is generally followed by thermal afterdrying/aftercuring of the image patterns.

Further pigments:

The inventive use of the metal azo pigments is preferably characterized in that they are employed alone or in mixtures with other pigments, customary for the production of colour filters, in the colour filters or pigment preparations or formulations for colour filters.

These "other pigments" may be other metal salts of an azo compound of the formula (I), or pigment preparations based thereon, or else other organic or inorganic pigments.

As far as the selection of other pigments for optional accompanying use is concerned, the invention imposes no restriction. Both organic and inorganic pigments are suitable.

Preferred organic pigments are, for example, those of the monoazo, disazo, laked azo, β-naphthol, Naphtol AS, benzimidazolone, disazocondensation, azo metal complex, isoindoline and isoindolinone series, and also polycyclic pigments such as, for example, from the phthalocyanine, quinacridone, perylene, perinone, thioindigo, anthraquinone, dioxazine, quinophthalone and diketopyrrolopyrrole series. Additionally, laked dyes such as Ca, Mg and Al lakes of dyes containing sulphonic or carboxylic acid groups.

Examples of other organic pigments for optional accompanying use are as follows:

Colour Index Pigment Yellow 12, 13, 14, 17, 20, 24, 74, 83, 86, 93, 94, 109, 110, 117, 125, 137, 138, 139, 147, 148, 150, 153, 154, 166, 173, 185, or Colour Index Pigment Orange 13, 31, 36, 38, 40, 42, 43, 51, 55, 59, 61, 64, 65, 71, 72, 73 or Colour Index Pigment Red 9, 97, 122, 123, 144, 149, 166, 168, 177, 180, 192, 215, 216, 224, 254, 272, or Colour Index Pigment Green 7, 10, 36, 37, 45, 58 or Colour Index Pigment Blue 15, 15:1, 15:2, 15:3, 15:4, 15:6, 16, and Colour Index Pigment Violet 19 and 23.

It is also possible, furthermore, for soluble organic dyes to be used in conjunction with the new pigments of the invention.

Where "other pigments" are additionally used, the fraction of metal azo pigment of the invention is preferably 1-99 wt %, more particularly 20-80 wt %, based on the total amount of all pigments used. Particularly preferred are the pigment preparations of the invention and also formulations comprising at least one metal azo pigment of the invention and C.I. Pigment Green 36 and/or C.I. Pigment Green 58 in a ratio of 20 to 80 wt % of metal azo pigment to 80 to 20 wt % of C.I. Pigment Green 36 and/or C.I. Pigment Green 58, preferably of 40 to 60 wt % to 60 to 40 wt %.

In accordance with the invention there is no particular restriction on binder resins which can be used together with the "pigment" or pigment preparation based thereon in colour filters and/or in the formulations for producing colour filters, in accordance for example with the pigment dispersion method; more particularly, film-forming resins known per se are suitable for application in colour filters.

Examples of suitable binder resins are those from the group of the cellulose resins such as carboxymethylhydroxyethylcellulose and hydroxyethylcellulose, acrylic resins, alkyd resins, melamine resins, epoxy resins, polyvinyl alcohols, polyvinylpyrrolidones, polyamides, polyamideimines, polyimides, polyimide precursors such as those of the formula (14), disclosed in JP-A 11 217 514 and esterification products thereof.

Examples of such include reaction products of tetracarboxylic dianhydride with diamines.

Further suitable binder resins are those which contain photopolymerizable unsaturated bonds. The binder resins may for example be those constructed from the group of the acrylic resins. Particularly noteworthy in this context are monomers and copolymers of polymerizable monomers such as, for example, methyl(meth)acrylate, ethyl(meth)acrylate, propyl (meth)acrylate, butyl(meth)acrylate, styrene and styrene derivatives, and also copolymers between carboxyl-bearing polymerizable monomers such as (meth)acrylic acid, itaconic acid, maleic acid, maleic anhydride, maleic acid monoalkyl esters, especially with alkyl of 1 to 12 C atoms, and polymerizable monomers such as (meth)acrylic acid, styrene and styrene derivatives, such as α-methylstyrene, m- or p-methoxystyrene or p-hydroxystyrene, for example. Examples include reaction products of carboxyl-containing polymeric compounds with compounds which contain both an oxirane ring and an ethylenically unsaturated bond such as, for example, glycidyl(meth)acrylate, acryloyl glycidyl ether and itaconic acid monoalkyl glycidyl ether, etc., and also reaction products of carboxyl-containing polymeric compounds with compounds which contain both a hydroxyl group and an ethylenically unsaturated bond (unsaturated alcohols) such as allyl alcohol, 2-buten-4-ol, oleyl alcohol, 2-hydroxyethyl (meth)acrylate, N-methylolacrylamide, etc.;

additionally it is possible as well for such binder resins to contain unsaturated compounds which possess free isocyanate groups.

Generally speaking, the equivalence of the unsaturation (molar weight of binder resin per unsaturated bond) of the stated binder resins is 200 to 3000, more particularly 230 to 1000, in order to attain both sufficient photopolymerizability and film hardness. The acid value is generally 20 to 300, more particularly 40 to 200, in order to obtain sufficient alkali developability following film exposure.

The average molar weight of the binder resins to be used is between 1500 and 200 000, more particularly 10 000 to 50 000 g/mol.

The organic solvents used in the case of the inventive use for the pigment preparations for colour fillers are, for example, ketones, alkylene glycol ethers, alcohols and aromatic compounds. Examples from the ketones group are as follows: acetone, methyl ethyl ketone, cyclohexanone, etc.; from the group of the alkylene glycol ethers: methyl Cellosolve (ethylene glycol monomethyl ester), butyl Cellosolve (ethylene glycol monobutyl ether), methyl Cellosolve acetate, ethyl Cellosolve acetate, butyl Cellosolve acetate, ethylene glycol monopropyl ether, ethylene glycol monohexyl ether, ethylene glycol dimethyl ether, diethylene glycol ethyl ether, diethylene glycol diethyl ether, propylene glycol monomethyl ether, propylene glycol monoethyl ether, propylene glycol monopropyl ether, propylene glycol monobutyl ether, propylene glycol monomethyl ether acetate, diethylene glycol methyl ether acetate, diethylene glycol ethyl ether acetate, diethylene glycol propyl ether acetate, diethylene glycol isopropyl ether acetate, diethylene glycol butyl ether acetate, diethylene glycol tert-butyl ether acetate, triethylene glycol methyl ether acetate, triethylene glycol ethyl ether acetate, triethylene glycol propyl ether acetate, triethylene glycol isopropyl ether acetate, triethylene glycol butyl ether acetate, triethylene glycol tert-butyl ether acetate, etc.; from the group of the alcohols: methyl alcohol, ethyl alcohol, isopropyl alcohol, n-butyl alcohol, 3-methyl-3-methoxybutanol, etc.; from the group of the aromatic solvents: benzene, toluene, xylene, N-methyl-2-pyrrolidone, etc.

Further other solvents are 1,2-propanediol diacetate, 3-methyl-3-methoxybutyl acetate, ethyl acetate, N-hydroxymethyl-2-acetic acid ethyl ester, tetrahydrofuran, etc. The solvents can be used individually or in mixtures with one another.

The invention further relates to a photoresist comprising at least one metal azo pigment of the invention or at least one pigment preparation of the invention and at least one photocurable monomer and also at least one photoinitiator.

The photocurable monomers contain in the molecule at least one reactive double bond and optionally other reactive groups.

Photocurable monomers are understood in this context in particular to be reactive solvents or what are called reactive diluents, from the group, for example, of mono-, di-, tri- and multi-functional acrylates and methacrylates, vinyl ethers, and also glycidyl ethers. Suitable reactive groups additionally present include allyl, hydroxyl, phosphate, urethane, secondary amine and N-alkoxy-methyl groups.

Monomers of these kinds are known to the skilled person and are recited for example in *Römpp Lexikon, Lacke und Druckfarben*, Dr. Ulrich Zorll, Thieme Verlag Stuttgart-New York, 1998, pp. 491/492.

The selection of the monomers is guided in particular by the nature and intensity of the type of exposure radiation used, the desired reaction with the photoinitiator, and the film properties. Combinations of monomers can also be used.

Photoreaction initiators or photoinitiators are compounds which by virtue of the absorption of visible or ultraviolet radiation form reactive intermediates which are able to set off a polymerization reaction of, for example, the above mentioned monomers and/or binder resins. Photoreaction initiators are likewise common knowledge and may likewise be found in *Römpp Lexikon, Lacke und Druckfarben*, Dr. Ulrich Zorll, Thieme Verlag Stuttgart-New York, 1998, pp. 445/446.

In accordance with the invention there is no restriction on the photocurable monomers or photoinitiators to be used.

The invention relates preferably to photoresists comprising
A) at least one metal azo pigment of the invention, more particularly in a mixture with other pigments, preferably C.I. Pigment Green 36 and/or Pigment Green 58, or a pigment preparation of the invention, based thereon,
B1) at least one photocurable monomer,
B2) at least one photoinitiator,
C1) optionally an organic solvent,
D) optionally a dispersant,
E) optionally a binder resin,
and also, optionally, further additions.

In accordance with the invention there is also no restriction on the technology for generating the coloured image element patterns on the basis of the pigments or solid pigment preparations for use in accordance with the invention. Besides the above-described photolithographic process, other processes are also suitable, such as offset printing, chemical etching or ink jet printing. The selection of the appropriate binder resins and solvents or pigment vehicles and also further additions should be made in line with the particular process. In the case of the ink jet process, which comprehends not only thermal but also mechanical and piezo-mechanical ink jet printing, aqueous-organic vehicles for the pigments and optionally binder resins are suitable as well as purely organic vehicles; in fact, aqueous-organic vehicles are preferred.

The examples which follow are intended to elucidate the present invention, but without confining it to them.

EXAMPLES

Preparation of the Azo Barbituric Acid Precursor (Instruction 1)

Introduced into 1100 g of distilled water at 85° C. were 46.2 g of diazobarbituric acid and 38.4 g of barbituric acid. The pH was then adjusted to about pH 5 using aqueous potassium hydroxide solution, followed by 90 minutes of stirring.

Example 1

Preparation of Pigment A (Not Inventive)

An azobarbituric acid (0.3 mol) prepared according to instruction 1 was admixed at 82° C. with 1500 g of distilled water. Thereafter 75.7 g of melamine (0.6 mol) were introduced. Then 0.3 mol of an approximately 30% strength zinc chloride solution was added dropwise. After 3 hours at 82° C., the pH was adjusted to about 5.5 using KOH. This was followed by dilution at 90° C. with about 300 g of distilled water. Then 34 g of 30% strength hydrochloric acid were added dropwise and a temperature of 90° C. was established for 12 hours. Thereafter the pH was adjusted to about 5 using aqueous potassium hydroxide solution. The pigment was subsequently isolated on a suction filter, washed, dried in a vacuum drying cabinet at 80° C., and ground for about 2 minutes in a standard laboratory mill. (Pigment A=adduct of zinc azobarbituric acid and melamine).

Example 2

Preparation of Pigment B (Not Inventive)

An azobarbituric acid (0.3 mol) prepared according to instruction 1 was admixed at 82° C. with 1500 g of distilled water. Then 10 g of 30% strength hydrochloric acid were added dropwise, to adjust the pH to 2-2.5. Thereafter 79.4 g of melamine (0.63 mol) were introduced. Then 0.3 mol of an approximately 25% strength nickel chloride solution was added dropwise. After 3 hours at 82° C., the pH was adjusted to about 5.5 using KOH. This was followed by dilution at 90° C. with about 100 g of distilled water. Then 21 g of 30% strength hydrochloric acid were added dropwise and a temperature of 90° C. was established for 12 hours. Thereafter the pH was adjusted to about 5 using aqueous potassium hydroxide solution. The pigment was subsequently isolated on a suction filter, washed, dried in a vacuum drying cabinet at 80° C., and ground for about 2 minutes in a standard laboratory mill. (Pigment B=adduct of nickel azobarbituric acid and melamine).

Examples 3-5

Preparation of the Pigments C, D and E (Inventive)

In the inventive Examples 3 to 5 below, the procedure of Example 2 was repeated, but the nickel chloride solution was replaced by a mixed solution of nickel chloride and zinc chloride.

Example 3

0.3 mol Ni replaced by 0.225 mol Ni+0.075 mol Zn (pigment C=melamine adduct of zinc/nickel azobarbituric acid, hybrid compound with 25 mol % Zn and 75 mol % nickel)

Example 4

0.3 mol Ni replaced by 0.150 mol Ni+0.150 mol Zn (pigment D=melamine adduct of zinc/nickel azobarbituric acid, hybrid compound with 50 mol % Zn and 50 mol % nickel)

Example 5

0.3 mol Ni replaced by 0.075 mol Ni+0.225 mol Zn (pigment E=melamine adduct of zinc/nickel azobarbituric acid, hybrid compound with 75 mol % Zn and 25 mol % nickel)

Analysis by X-ray Diffractometry

The X-ray diffractometry measurements were carried out in a PANalytical EMPYREAN theta/theta reflection diffractometer with PIXcel counter, suitable for the identification of crystalline phases.

Instrument settings:

| | |
|---|---|
| Diffractometer system | EMPYREAN |
| Measurement programme | Scan 5-40 Standard_Reflexion VB, 17 mm irradiated length, 15 mm mask |
| Start position [°2th.] | 5.0066 |
| End position [°2th.] | 39.9896 |
| Step size [°2th.] | 0.0130 |
| Step time [s] | 48.1950 |
| Scan mode | Continuous |
| OED operation type | Scanning |
| OED length [°2th.] | 3.35 |
| Type of divergence slit | Automatic |
| Irradiated length [mm] | 17.00 |
| Sample length [mm] | 10.00 |
| Anode material | Cu |
| K-alpha1 [Å] | 1.54060 |
| K-alpha2 [Å] | 1.54443 |
| K-beta [Å] | 1.39225 |
| K-A2/K-A1 ratio | 0.50000 |
| Filter | Nickel |
| Generator setting | 40 mA, 40 kV |
| Goniometer radius [mm] | 240.00 |

-continued

| | |
|---|---|
| Distance from focus to divergence slit [mm] | 100.00 |
| Primary beam monochromator | None |
| Sample rotation | Yes |

Procedure:

From the pigments prepared according to synthesis Examples 1 to 5, samples 1 to 8 with the following constitution were provided:

Sample 1: 10 g pigment B (100 mol % nickel) not inventive

Sample 2: 10 g pigment A (100 mol % zinc) not inventive

Sample 3: 10 g pigment C (25 mol % zinc/75 mol % nickel) inventive

Sample 4: 10 g pigment D (50 mol % zinc/50 mol % nickel) inventive

Sample 5: 10 g pigment E (75 mol % zinc/25 mol % nickel) inventive

Sample 6: 2.5 g pigment A and 7.5 g pigment B (physical mixture 25 mol % zinc and 75 mol % nickel) not inventive Sample 7: 5.0 g pigment A and 5.0 g pigment B (physical mixture 50 mol % zinc and 50 mol % nickel) not inventive Sample 8: 7.5 g pigment A and 2.5 g pigment B (physical mixture 75 mol % zinc and 25 mol % nickel) not inventive For the theta/theta measurements, a quantity of each sample under test was introduced into the well of the sample holder. The surface of the sample was leveled with a scraper.

The sample holder was then introduced into the sample changer of the diffractometer, and the measurement was performed. The theta values for the samples measured were determined in accordance with the method described above. Measurements on samples 1 to 8 were undertaken in this way. The reflection values determined in these measurements, following background correction, have been reproduced in Tables 1 to 8.

TABLE 1

Sample 1: 10 g pigment B (100 mol % nickel) not inventive

| No. | Pos. [°2th.] | d [Å] | Int. [cts] | Rel. Int. [%] |
|---|---|---|---|---|
| 1 | 8.4937 | 10.41046 | 10 737.84 | 92.96 |
| 2 | 9.2193 | 9.59272 | 5937.69 | 51.40 |
| 3 | 9.9533 | 8.87958 | 713.64 | 6.18 |
| 4 | 15.3758 | 5.75807 | 2133.92 | 18.47 |
| 5 | 15.6201 | 5.67326 | 3580.93 | 31.00 |
| 6 | 16.4733 | 5.38130 | 3356.57 | 29.06 |
| 7 | 17.1275 | 5.17721 | 5106.25 | 44.21 |
| 8 | 17.8337 | 4.96963 | 1264.69 | 10.95 |
| 9 | 18.6258 | 4.76398 | 9932.31 | 85.81 |
| 10 | 19.1260 | 4.63666 | 2584.15 | 22.37 |
| 11 | 20.2938 | 4.37604 | 9150.29 | 79.21 |
| 12 | 23.2611 | 3.82409 | 6588.29 | 57.04 |
| 13 | 23.8331 | 3.73359 | 7138.31 | 61.80 |
| 14 | 24.9686 | 3.56631 | 3035.45 | 26.10 |
| 15 | 26.3622 | 3.38086 | 11 551.25 | 100.00 |
| 16 | 27.2200 | 3.27624 | 10 120.18 | 87.61 |
| 17 | 27.9441 | 3.19033 | 1697.73 | 14.70 |
| 18 | 30.1838 | 2.96095 | 3156.17 | 27.32 |
| 19 | 30.4187 | 2.93862 | 3540.55 | 30.65 |
| 20 | 31.4155 | 2.84526 | 1883.03 | 36.30 |
| 21 | 31.9223 | 2.80123 | 2459.97 | 21.30 |
| 22 | 32.2692 | 2.77420 | 2448.70 | 21.20 |
| 23 | 34.5979 | 2.59263 | 1200.82 | 10.40 |
| 24 | 35.8594 | 2.50426 | 1032.86 | 8.94 |
| 25 | 36.5485 | 2.45861 | 3095.45 | 26.80 |
| 26 | 37.6990 | 2.38618 | 5516.95 | 47.76 |
| 27 | 38.2824 | 2.34921 | 1075.19 | 9.31 |
| 28 | 39.8281 | 2.26153 | 769.37 | 6.66 |

TABLE 2

Sample 2: 10 g pigment A (100 mol % zinc) not inventive

| No. | Pos. [°2th.] | d [Å] | Int. [cts] | Rel. Int. [%] |
|---|---|---|---|---|
| 1 | 6.2962 | 14.03826 | 2925.18 | 23.19 |
| 2 | 10.1053 | 8.74633 | 1252.80 | 9.93 |
| 3 | 10.5689 | 8.37065 | 2083.81 | 16.52 |
| 4 | 14.3072 | 6.19078 | 919.16 | 7.29 |
| 5 | 16.4263 | 5.39659 | 1052.71 | 8.35 |
| 6 | 17.0074 | 5.20917 | 474.33 | 3.76 |
| 7 | 20.0526 | 4.42446 | 460.54 | 3.65 |
| 8 | 20.8493 | 4.26069 | 1906.56 | 15.12 |
| 9 | 21.1699 | 4.19688 | 1393.01 | 11.04 |
| 10 | 26.0149 | 3.42237 | 3794.79 | 30.09 |
| 11 | 26.6611 | 3.34363 | 11 939.89 | 94.67 |
| 12 | 26.8850 | 3.31356 | 10 515.37 | 83.37 |
| 13 | 27.3308 | 3.26321 | 12 612.46 | 100.00 |
| 14 | 29.0144 | 3.07757 | 2098.82 | 16.64 |
| 15 | 31.4157 | 2.84760 | 868.19 | 6.88 |
| 16 | 32.0284 | 2.79219 | 722.81 | 5.73 |
| 17 | 35.9510 | 2.49809 | 501.44 | 3.98 |

TABLE 3

Sample 3: 10 g pigment C (25 mol % zinc/75 mol % nickel) inventive

| No. | Pos. [°2th.] | d [Å] | Int. [cts] | Rel. Int. [%] |
|---|---|---|---|---|
| 1 | 8.5100 | 10.39063 | 10 820.62 | 98.21 |
| 2 | 9.3063 | 9.50322 | 5110.61 | 46.38 |
| 3 | 11.2104 | 7.89303 | 449.45 | 4.08 |
| 4 | 15.2895 | 5.79519 | 2041.10 | 18.53 |
| 5 | 15.5483 | 5.69932 | 2969.46 | 26.95 |
| 6 | 16.5322 | 5.36226 | 3896.54 | 35.37 |
| 7 | 17.1488 | 5.17082 | 5031.51 | 45.67 |
| 8 | 18.6959 | 4.74627 | 9858.93 | 89.48 |
| 9 | 20.3468 | 4.36475 | 7510.12 | 68.16 |
| 10 | 23.2127 | 3.83195 | 4836.88 | 43.90 |
| 11 | 23.8974 | 3.72368 | 6052.54 | 54.93 |
| 12 | 24.8727 | 3.57984 | 2513.84 | 22.82 |
| 13 | 26.3954 | 3.37669 | 11 017.87 | 100.00 |
| 14 | 27.3200 | 3.26447 | 8607.53 | 78.12 |
| 15 | 28.4256 | 3.13997 | 1395.94 | 12.67 |
| 16 | 30.2248 | 2.95703 | 3236.77 | 29.38 |
| 17 | 30.4275 | 2.93779 | 3390.06 | 30.77 |
| 18 | 32.2293 | 2.77754 | 2545.04 | 23.10 |
| 19 | 34.5339 | 2.59728 | 1302.65 | 11.82 |
| 20 | 36.4324 | 2.46618 | 3206.25 | 29.10 |
| 21 | 37.5208 | 2.39512 | 4007.95 | 36.38 |
| 22 | 37.6732 | 2.38776 | 5514.17 | 50.05 |
| 23 | 38.8699 | 2.31696 | 334.53 | 3.04 |
| 24 | 39.7923 | 2.26535 | 768.98 | 6.98 |

TABLE 4

Sample 4: 10 g pigment D (50 mol % zinc/50 mol % nickel) inventive

| No. | Pos. [°2th.] | d [Å] | Int. [cts] | Rel. Int. [%] |
|---|---|---|---|---|
| 1 | 8.5583 | 10.33202 | 14 205.33 | 95.11 |
| 2 | 9.2650 | 9.54547 | 7410.93 | 49.62 |
| 3 | 11.8732 | 7.45388 | 396.41 | 2.65 |
| 4 | 15.7248 | 5.63572 | 3924.66 | 26.28 |
| 5 | 16.5543 | 5.35515 | 4966.76 | 33.25 |
| 6 | 17.0654 | 5.19592 | 7290.50 | 48.81 |
| 7 | 18.6670 | 4.75356 | 14 936.10 | 100.00 |
| 8 | 19.1522 | 4.63422 | 4782.57 | 32.02 |
| 9 | 19.8789 | 4.46642 | 5704.31 | 38.19 |
| 10 | 20.2236 | 4.39105 | 11 829.90 | 79.20 |
| 11 | 23.2723 | 3.82227 | 8493.82 | 56.87 |
| 12 | 24.0296 | 3.70349 | 5408.77 | 36.21 |
| 13 | 24.8739 | 3.57996 | 4108.57 | 27.51 |
| 14 | 26.4122 | 3.37457 | 14 682.98 | 98.31 |

TABLE 4-continued

Sample 4: 10 g pigment D (50 mol % zinc/50 mol % nickel) inventive

| No. | Pos. [°2th.] | d [Å] | Int. [cts] | Rel. Int. [%] |
|---|---|---|---|---|
| 15 | 27.2517 | 3.27250 | 13 145.84 | 88.01 |
| 16 | 28.4856 | 3.13349 | 1412.89 | 9.46 |
| 17 | 30.0794 | 2.97099 | 3555.63 | 23.81 |
| 18 | 30.4815 | 2.93271 | 4548.19 | 30.45 |
| 19 | 31.6862 | 2.82391 | 3789.55 | 25.37 |
| 20 | 32.1567 | 2.78365 | 3161.73 | 21.37 |
| 21 | 34.6478 | 2.58901 | 2429.89 | 16.27 |
| 22 | 35.8151 | 2.50726 | 1794.88 | 12.02 |
| 23 | 36.3090 | 2.47428 | 4576.23 | 30.64 |
| 24 | 37.5392 | 2.39597 | 6342.19 | 42.46 |
| 25 | 38.2636 | 2.35226 | 1300.43 | 8.71 |
| 26 | 38.8683 | 2.31705 | 495.46 | 3.32 |
| 27 | 39.4974 | 2.27970 | 1467.31 | 9.82 |
| 28 | 39.6359 | 2.27393 | 2202.84 | 14.75 |

TABLE 5

Sample 5: 10 g pigment E (75 mol % zinc/25 mol % nickel) inventive

| No. | Pos. [°2th.] | d [Å] | Int. [cts] | Rel. Int. [%] |
|---|---|---|---|---|
| 1 | 8.5997 | 10.28242 | 17 439.16 | 84.72 |
| 2 | 9.3269 | 9.48227 | 10 905.46 | 52.98 |
| 3 | 11.9567 | 7.40202 | 607.58 | 2.95 |
| 4 | 15.4091 | 5.75046 | 4709.94 | 22.88 |
| 5 | 15.7436 | 5.62906 | 4361.38 | 21.19 |
| 6 | 16.5923 | 5.34299 | 6443.75 | 31.31 |
| 7 | 17.1493 | 5.17074 | 1666.94 | 51.82 |
| 8 | 17.8032 | 4.98220 | 2102.48 | 10.21 |
| 9 | 18.7116 | 4.74232 | 20 583.65 | 100.00 |
| 10 | 19.1644 | 4.63131 | 6250.10 | 30.36 |
| 11 | 19.8394 | 4.47523 | 6459.78 | 31.38 |
| 12 | 20.1984 | 4.39648 | 16 143.92 | 78.43 |
| 13 | 23.2351 | 3.82831 | 13 401.31 | 65.11 |
| 14 | 23.6492 | 3.76220 | 9591.56 | 46.60 |
| 15 | 24.0145 | 3.70580 | 7022.98 | 34.32 |
| 16 | 24.8665 | 3.58072 | 5675.70 | 27.57 |
| 17 | 25.3404 | 3.51482 | 2759.72 | 13.41 |
| 18 | 26.4625 | 3.36827 | 18 636.12 | 90.54 |
| 19 | 27.3170 | 3.26482 | 18 179.60 | 88.32 |
| 20 | 28.1857 | 3.16614 | 2784.33 | 13.53 |
| 21 | 30.0457 | 2.97424 | 3887.21 | 18.88 |
| 22 | 30.5156 | 2.92951 | 5793.01 | 28.14 |
| 23 | 31.1461 | 2.87163 | 2845.72 | 13.83 |
| 24 | 31.7069 | 2.82211 | 5876.87 | 28.55 |
| 25 | 32.1318 | 2.78575 | 3359.47 | 16.32 |
| 26 | 34.6450 | 2.58921 | 3678.44 | 17.87 |
| 27 | 36.2235 | 2.47993 | 5658.66 | 27.49 |
| 28 | 37.4969 | 2.39858 | 6393.26 | 31.06 |
| 29 | 38.1304 | 2.35822 | 1850.95 | 8.99 |
| 30 | 38.8146 | 2.31822 | 672.95 | 3.27 |
| 31 | 39.4769 | 2.28272 | 3292.00 | 15.99 |

TABLE 6

Sample 6: 2.5 g pigment A and 7.5 g pigment B (physical mixture 25 mol % zinc and 75 mol % nickel) not inventive

| No. | Pos. [°2th.] | d [Å] | Int. [cts] | Rel. Int. [%] |
|---|---|---|---|---|
| 1 | 6.2589 | 14.12187 | 583.11 | 5.14 |
| 2 | 8.5447 | 10.34848 | 8270.60 | 72.89 |
| 3 | 9.2672 | 9.54325 | 4712.85 | 41.54 |
| 4 | 10.5920 | 8.35245 | 569.78 | 5.02 |
| 5 | 15.4448 | 5.73725 | 2304.67 | 20.31 |
| 6 | 15.7629 | 5.62219 | 2918.60 | 25.72 |
| 7 | 16.5916 | 5.34321 | 3061.89 | 26.99 |
| 8 | 17.1067 | 5.18347 | 4307.63 | 37.96 |
| 9 | 18.6222 | 4.76489 | 7827.36 | 68.98 |

TABLE 6-continued

Sample 6: 2.5 g pigment A and 7.5 g pigment B (physical mixture 25 mol % zinc and 75 mol % nickel) not inventive

| No. | Pos. [°2th.] | d [Å] | Int. [cts] | Rel. Int. [%] |
|---|---|---|---|---|
| 10 | 20.4178 | 4.34974 | 6673.87 | 58.82 |
| 11 | 23.3109 | 3.81603 | 4928.90 | 43.44 |
| 12 | 23.9491 | 3.71577 | 5049.74 | 44.50 |
| 13 | 24.8993 | 3.57608 | 2026.01 | 17.86 |
| 14 | 26.4393 | 3.37117 | 11 004.12 | 96.98 |
| 15 | 27.2626 | 3.27121 | 11 346.51 | 100.00 |
| 16 | 28.9857 | 3.08055 | 520.51 | 4.59 |
| 17 | 30.5963 | 2.92197 | 2087.68 | 18.40 |
| 18 | 31.3342 | 2.85482 | 1775.08 | 15.64 |
| 19 | 32.3696 | 2.76583 | 1928.02 | 16.99 |
| 20 | 34.7356 | 2.58267 | 1132.64 | 9.98 |
| 21 | 35.7490 | 2.51174 | 864.78 | 7.62 |
| 22 | 36.0372 | 2.49231 | 1168.80 | 10.30 |
| 23 | 36.6646 | 2.45109 | 2435.23 | 21.46 |
| 24 | 37.8164 | 2.37905 | 4520.57 | 39.84 |
| 25 | 38.9036 | 2.31503 | 500.48 | 4.41 |
| 26 | 39.7636 | 2.26692 | 387.54 | 3.42 |

TABLE 7

Sample 7: 5.0 g pigment A and 5.0 g pigment B (physical mixture 50 mol % zinc and 50 mol % nickel) not inventive

| No. | Pos. [°2th.] | d [Å] | Int. [cts] | Rel. Int. [%] |
|---|---|---|---|---|
| 1 | 6.3554 | 13.90762 | 1332.81 | 11.21 |
| 2 | 8.6079 | 10.27265 | 4854.06 | 40.82 |
| 3 | 9.2074 | 9.60514 | 3022.44 | 25.42 |
| 4 | 10.6297 | 8.32291 | 968.83 | 8.15 |
| 5 | 14.2884 | 6.19891 | 498.12 | 4.19 |
| 6 | 15.7123 | 5.64018 | 2012.37 | 16.92 |
| 7 | 16.4890 | 5.37622 | 2234.67 | 18.79 |
| 8 | 17.1513 | 5.17007 | 2910.07 | 24.47 |
| 9 | 18.6611 | 4.75506 | 5185.80 | 43.61 |
| 10 | 20.3555 | 4.36290 | 5194.34 | 43.68 |
| 11 | 21.3948 | 4.15327 | 403.41 | 3.39 |
| 12 | 23.2904 | 3.81935 | 3104.21 | 26.11 |
| 13 | 24.0601 | 3.69888 | 2427.07 | 20.41 |
| 14 | 25.0058 | 3.56110 | 1575.41 | 13.25 |
| 15 | 26.3981 | 3.37635 | 10 031.36 | 84.36 |
| 16 | 27.3159 | 3.26495 | 11 890.57 | 100.00 |
| 17 | 29.0285 | 3.07611 | 1009.90 | 8.49 |
| 18 | 30.5702 | 2.92441 | 1329.14 | 11.18 |
| 19 | 31.4244 | 2.84683 | 1462.06 | 12.30 |
| 20 | 32.2851 | 2.77288 | 1669.50 | 14.04 |
| 21 | 34.5711 | 2.59458 | 810.73 | 6.82 |
| 22 | 35.9880 | 2.49561 | 1238.27 | 10.41 |
| 23 | 36.6030 | 2.45508 | 2054.04 | 17.27 |
| 24 | 37.8154 | 2.37911 | 3203.32 | 26.94 |
| 25 | 38.9622 | 2.31168 | 406.97 | 3.42 |

TABLE 8

Sample 8: 7.5 g pigment A and 2.5 g pigment B (physical mixture 75 mol % zinc and 25 mol % nickel) not inventive

| No. | Pos. [°2th.] | d [Å] | Int. [cts] | Rel. Int. [%] |
|---|---|---|---|---|
| 1 | 6.3215 | 13.98199 | 2052.53 | 16.93 |
| 2 | 8.5164 | 10.38277 | 2318.30 | 19.12 |
| 3 | 9.2296 | 9.58204 | 1348.65 | 11.12 |
| 4 | 10.4417 | 8.47234 | 1740.81 | 14.36 |
| 5 | 14.2608 | 6.21084 | 761.33 | 6.28 |
| 6 | 15.5542 | 5.69717 | 1125.12 | 9.28 |
| 7 | 16.4001 | 5.40516 | 1773.71 | 14.63 |
| 8 | 17.1125 | 5.18172 | 1973.02 | 16.27 |
| 9 | 17.7794 | 4.98883 | 659.31 | 5.44 |
| 10 | 18.7051 | 4.74397 | 2778.24 | 22.91 |
| 11 | 20.4031 | 4.35284 | 3133.33 | 25.84 |
| 12 | 21.1058 | 4.20947 | 1408.51 | 11.62 |

TABLE 8-continued

Sample 8: 7.5 g pigment A and 2.5 g pigment B (physical mixture 75 mol % zinc and 25 mol % nickel) not inventive

| No. | Pos. [°2th.] | d [Å] | Int. [cts] | Rel. Int. [%] |
|---|---|---|---|---|
| 13 | 23.2661 | 3.82327 | 1358.95 | 11.21 |
| 14 | 23.9364 | 3.71771 | 1596.72 | 13.17 |
| 15 | 24.9618 | 3.56727 | 729.77 | 6.02 |
| 16 | 26.4936 | 3.36440 | 10 202.91 | 84.14 |
| 17 | 27.3656 | 3.25913 | 12 125.45 | 100.00 |
| 18 | 29.1379 | 3.06481 | 1150.21 | 9.49 |
| 19 | 30.4587 | 2.93485 | 629.46 | 5.19 |
| 20 | 31.3787 | 2.85087 | 1038.02 | 8.56 |
| 21 | 32.3482 | 2.76761 | 1090.73 | 9.00 |
| 22 | 34.3427 | 2.61131 | 310.13 | 2.56 |
| 23 | 36.0003 | 2.49479 | 1056.93 | 8.72 |
| 24 | 36.6259 | 2.45360 | 1257.43 | 10.37 |
| 25 | 37.8218 | 2.37872 | 1793.53 | 14.79 |

In Tables 1 to 8, the reflections measured have been numbered in the first column. In column 2, the position of the measured reflections has been reported in the form of 2theta values; in column 3, the 2theta values ascertained have been converted, using the Bragg equation, into d values for the lattice constants. The fourth and fifth columns contain the values for the measured intensities (peak height of the reflections above the background), on the one hand as absolute values in the unit "counts" [cts], and also in their relative intensity, in percent.

Evaluation of the X-ray diffractometry measurements of Tables 1 to 8 shows that the inventive metal azo pigments C, D and E of samples 3, 4 and 5 each exhibit a signal $S_1$ having an intensity $I_1$ in the X-ray diffractogram with a lattice constant of d=10.3 (±0.2) Å. In the lattice constant range from d=16.05 Å to d=11.78 Å, in contrast, the metal azo pigments of samples 3, 4 and 5 do not exhibit any signal $S_2$ whose intensity $I_2$ exceeds three times the square root of the background. By definition, a measured reflection is only rated as an actual peak when its intensity is greater than 3 σ (sigma), the σ value being defined as the square root of the value for the background. The value for the background is given by the number of counts measured at the beginning of the diffractogram. With the diffractometer used, the background of the diffractogram is approximately 4100 counts, and so a peak becomes detectable only above about 200 counts (3 times value over σ=192.09, with σ=square root of 4100 counts=64.03). The intensity values reported in Tables 1 to 8 are background-corrected. This means that the value for the background (of 4100 counts in the case of the instrument used here) was subtracted arithmetically in each case from all of the intensity values measured. For samples 3, 4 and 5 of the inventive metal azo pigments C, D and E, this produces in each case a ratio of the intensity $I_1$ of the signals $S_1$ measured at d=10.3 (±0.2) Å to the smallest intensity value $I_2$ theoretically detectable (with the diffractometer used) in the range from d=16.05 Å to d=11.78 Å of approximately 200 counts (following background correction), expressed as ratio $I_2/I_1$, which does not exceed a figure of 0.02. This can be seen from Table 9.

Since no reflections greater than d=10.3 (±0.2) Å were measured for samples 3, 4 and 5, Tables 3, 4 and 5 have no values within that range.

It is likewise evident that the non-inventive physical pigment mixtures of samples 6, 7 and 8 each exhibit a signal $S_1$ with an intensity $I_1$ in the X-ray diffractogram with a lattice constant of d=10.3 (±0.2) Å, and in the lattice constant range from d=16.05 Å to d=11.78 Å they each exhibit signals $S_2$ whose intensities $I_2$, in each case in relation to the intensity $I_1$ of signal $S_1$, expressed as ratio $I_2/I_1$, exceed a figure of 0.02.

TABLE 9

| Sample | Pigment | $I_1$ [cts] of $S_1$ at d = 10.3 ± 0.2) Å | $I_2$ [cts] of $S_2$ at d = 11.78 to 16.05 Å | $I_2/I_1$ | Inventive |
|---|---|---|---|---|---|
| 3: | 10 g Pigment C | 10 820 | 200 * | 0.0185 | yes |
| 4: | 10 g Pigment D | 14 205 | 200 * | 0.0140 | yes |
| 5: | 10 g Pigment E | 17 439 | 200 * | 0.0115 | yes |
| 6: | 2.5 g Pigment A 7.5 g Pigment B | 8270 | 583 | 0.0704 | no |
| 7: | 5.0 g Pigment A 5.3 g Pigment B | 4854 | 1332 | 0.2744 | no |
| 8: | 6.0 g Pigment A 4.0 g Pigment B | 2318 | 2052 | 0.8852 | no |

* 200 counts correspond to the theoretically detectable intensity value of the diffractometer used Performance Testing The samples 1 to 8 were assembled as indicated above from the pigments prepared according to synthesis Examples 1 to 5. The samples were subsequently converted according to instruction 2 to give the corresponding dispersions. The dispersions 1 to 8 were converted in accordance with instruction 3 and subjected to performance testing. The results in the form of the Y values are set out in Table 10.

Instruction 2:

Approximately 2 g of a mixture of 2 parts of the pigment sample under test with 2 parts of plasticizer (BASF Hexamoll® Dinch), 1 part of dispersing additive (Byk Bykoplast® 1000) and 1 part of dispersing additive (Lubrizol® Solsperse 10000) were triturated on a paint dispersing machine (Auto muller type) 4× with 75 revolutions.

Instruction 3:

For each dispersion, 0.750 g was distributed uniformly into 1000 g of polystyrene pellets by vigorous shaking in a PE bag. The coloured pellets were extruded on a twin-screw extruder at 500 rpm and a melt temperature of 200° C. and then pelletized again. In addition, a polystyrene pellet sample without pigment, but wetted with the same amounts of additive and plasticizer, was extruded and pelletized as above.

Test plaques with a layer thickness gradation of 1 mm, 2 mm and 3 mm were produced from the dry pellets on an injection moulding machine with a melt temperature of 240° C., a back pressure of 10 bar and a mould temperature of 60° C. The transmission of 1 mm, 2 mm and 3 mm stages was measured using a spectrophotometer. The spectrophotometer was calibrated by means of the colourless test plaques at 1 mm, 2 mm and 3 mm in each case.

The CIE Yxy values for the D65 standard illuminant and a 10° observer angle are calculated for each layer thickness and CIE Y for reference value CIE x=0.435 was ascertained by means of interpolation.

TABLE 10

| Sample | Pigment | Dispersion | Y value (x = 0.435) | Inventive |
|---|---|---|---|---|
| 1: | 10 g Pigment B | 1 | 85.4 | no |
| 2: | 10 g Pigment A | 2 | 80.3 | no |
| 3: | 10 g Pigment C | 3 | 88.2 | yes |
| 4: | 10 g Pigment D | 4 | 86.6 | yes |
| 5: | 10 g Pigment E | 5 | 86.1 | yes |
| 6: | 2.5 g Pigment A 7.5 g Pigment B | 6 | 85.3 | no |
| 7: | 5.0 g Pigment A 5.3 g Pigment B | 7 | 85.5 | no |

TABLE 10-continued

| Sample | Pigment | Dispersion | Y value (x = 0.435) | Inventive |
|---|---|---|---|---|
| 8: | 6.0 g Pigment A 4.0 g Pigment B | 8 | 83.1 | no |

Result: as can be seen from Table 10, the inventive samples 3-5 exhibit increased Y values (for constant x value) in comparison to the non-inventive samples, and are therefore notable for an increased brightness.

What is claimed is:

1. Metal azo pigments comprising: the adduct of
a) at least two metal azo compounds of the formula (I) or tautomeric forms thereof

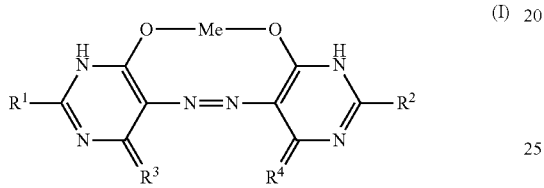

in which
$R^1$ and $R^2$ independently of one another are OH, $NH_2$ or $NHR^5$;
$R^3$ and $R^4$ independently of one another are $=O$ or $=NR^5$;
$R^5$ is hydrogen or alkyl; and
Me is a divalent or trivalent metal ion selected from the group consisting of $Ni^{2+}$, $Zn^{2+}$, $Cu^{2+}$, $Al^{3+}_{2/3}$, $Fe^{2+}$, $Fe^{3+}_{2/3}$, $Co^{2+}$ and $Co^{3+}_{2/3}$,
wherein the amount of metal ions from the series $Zn^{2+}$ and $Ni^{2+}$ is 95 to 100 mol % and the amount of metal ions selected from the group consisting of $Cu^{2+}$, $Al^{3+}_{2/3}$, $Fe^{2+}$, $Fe^{3+}_{2/3}$, $Co^{2+}$ and $Co^{3+}_{2/3}$ is 0 to 5 mol %, based in each case on one mole of all of the compounds of the formula (I), and
where the molar ratio of Zn to Ni metal ions in the sum total of the compounds of the formula (I) is 9:1 to 1:9, and
b) at least one compound of the formula (II)

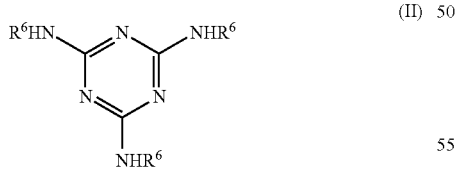

in which
$R^6$ is hydrogen or alkyl, which is optionally substituted by one or more OH groups,
wherein the X-ray diffractogram with a lattice constant of d=10.3 (±0.2) Å of the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

2. Metal azo pigments according to claim 1, comprising the adduct of
a) at least two metal azo compounds of the formula (I) or tautomeric forms thereof

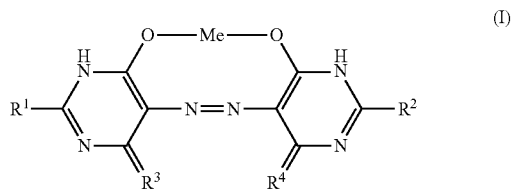

in which
$R^1$ and $R^2$ independently of one another are OH, $NH_2$ or $NHR^5$;
$R^3$ and $R^4$ independently of one another are $=O$ or $=NR^5$;
$R^5$ is hydrogen or $C_1$-$C_4$-alkyl; and
Me is a divalent or trivalent metal ion selected from the $Ni^{2+}$, $Zn^{2+}$, $Cu^{2+}$, $Al^{3+}_{2/3}$, $Fe^{2+}$, $Fe^{3+}_{2/3}$, $Co^{2+}$ and $Co^{3+}_{2/3}$,
wherein the amount of metal ions from the series $Zn^{2+}$ and $Ni^{2+}$ is 95 to 100 mol % and the amount of metal ions selected from the group consisting of $Cu^{2+}$, $Al^{3+}_{2/3}$, $Fe^{2+}$, $Fe^{3+}_{2/3}$, $Co^{2+}$ and $Co^{3+}_{2/3}$ is 0 to 5 mol %, based in each case on one mole of all of the compounds of the formula (I), and
where the molar ratio of Zn to Ni metal ions in the sum total of the compounds of the formula (I) is 9:1 to 1:9, and
b) at least one compound of the formula (II)

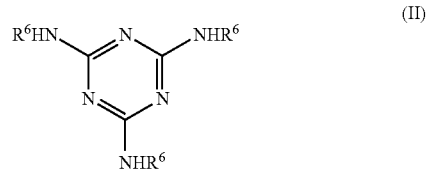

in which
$R^6$ is hydrogen or $C_1$-$C_4$-alkyl which is optionally substituted by one or more OH groups,
wherein the X-ray diffractogram with a lattice constant of d=10.3 (±0.2) Å of the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

3. Metal azo pigments according to claim 1, comprising the adduct of
a) a metal azo compound of the formula (Ia) or one of its tautomeric forms

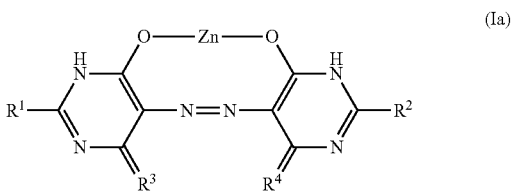

in which $R^1$ and $R^2$ independently of one another are OH, $NH_2$ or $NHR^5$;

$R^3$ and $R^4$ independently of one another are =O or =$NR^5$;

$R^5$ is hydrogen or $C_1$-$C_4$-alkyl; and a metal azo compound of the formula (Ib) or one of its tautomeric forms

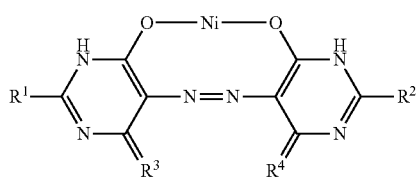

(Ib)

in which $R^1$ and $R^2$ independently of one another are OH, $NH_2$ or $NHR^5$;

$R^3$ and $R^4$ independently of one another are =O or =$NR^5$; and $R^5$ is hydrogen or $C_1$-$C_4$-alkyl; and optionally a compound of the formula (Ic)

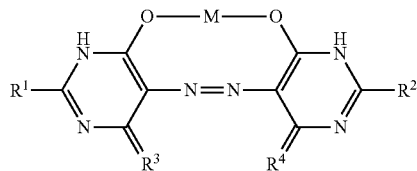

(Ic)

in which $R^1$ and $R^2$ independently of one another are OH, $NH_2$ or $NHR^5$;

$R^3$ and $R^4$ independently of one another are =O or =$NR^5$;

$R^5$ is hydrogen or $C_1$-$C_4$-alkyl; and

M is a divalent or trivalent metal ion selected from the group consisting of $Cu^{2+}$, $Al^{3+}{}_{2/3}$, $Fe^{2+}$, $Fe^{3+}{}_{2/3}$, $Co^{2+}$ and $Co^{3+}{}_{2/3}$, wherein the amount of metal ions from the series $Zn^{2+}$ and $Ni^{2+}$ is 95 to 100 mol % and the amount of metal ions selected from the group consisting of $Cu^{2+}$, $Al^{3+}{}_{2/3}$, $Fe^{2+}$, $Fe^{3+}{}_{2/3}$, $Co^{2+}$ and $Co^{3+}{}_{2/3}$ is 0 to 5 mol %, based in each case on one mole of all of the compounds of the formula (I), where the molar ratio of Zn to Ni metal ions in the sum total of the compounds of the formulae (Ia) and (Ib) is 9:1 to 1:9, and b) at least one compound of the formula (II)

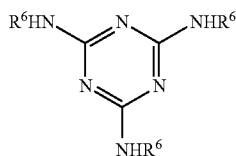

(II)

in which $R^6$ is hydrogen or $C_1$-$C_4$-alkyl, which is optionally substituted by one or more OH groups, wherein the X-ray diffractogram with a lattice constant of d=10.3 (±0.2) Å of the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

4. Metal azo pigments according to claim 1, comprising the adduct of a) a metal azo compound of the formula (Ia) or one of its tautomeric forms

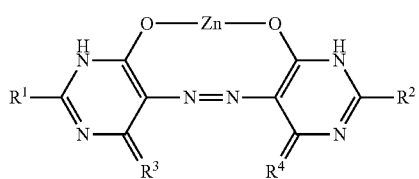

(Ia)

in which $R^1$ and $R^2$ independently of one another are OH, $NH_2$ or $NHR^5$;

$R^3$ and $R^4$ independently of one another are =O or =$NR^5$;

$R^5$ is hydrogen or $C_1$-$C_4$-alkyl; and a metal azo compound of the formula (Ib) or one of its tautomeric forms

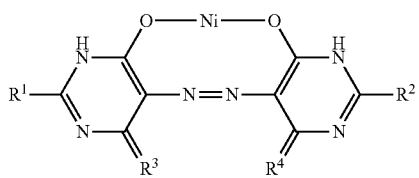

(Ib)

in which $R^1$ and $R^2$ independently of one another are OH, $NH_2$ or $NHR^5$;

$R^3$ and $R^4$ independently of one another are =O or =$NR^5$; and $R^5$ is hydrogen or $C_1$-$C_4$-alkyl; and wherein the amount of metal ions from the group consisting of $Zn^{2+}$ and $Ni^{2+}$ is 100 mol %, based on one mole of all of the compounds (Ia) and (Ib), where the molar ratio of Zn to Ni metal ions in the sum total of the compounds of the formulae (Ia) and (Ib) is 9:1 to 1:9, and b) at least one compound of the formula (II)

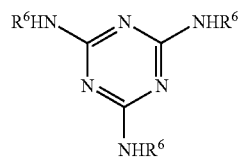

(II)

in which $R^6$ is hydrogen or $C_1$-$C_4$-alkyl, which is optionally substituted by one or more OH groups, wherein the X-ray diffractogram with a lattice constant of d=10.3 (±0.2) Å of the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

5. Metal azo pigments according to claim 1, comprising the adduct of
a) a metal azo compound of the formula (Ia) or one of its tautomeric forms

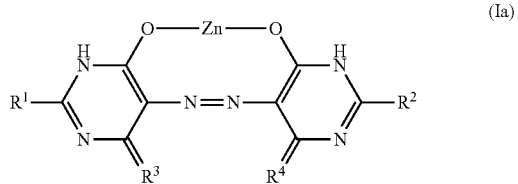
(Ia)

in which
$R^1$ and $R^2$ are OH;
$R^3$ and $R^4$ are =O;
and
a metal azo compound of the formula (Ib) or one of its tautomeric forms

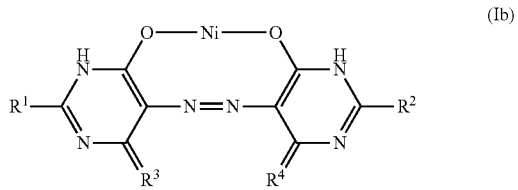
(Ib)

in which
$R^1$ and $R^2$ are OH; and
$R^3$ and $R^4$ are =O,
wherein the amount of metal ions of Zn and Ni is 100 mol %, based on one mole of compounds (Ia) and (Ib), where the molar ratio of Zn to Ni metal ions in the sum total of the compounds of the formulae (Ia) and (Ib) is 9:1 to 1:9,
and
b) at least one compound of the formula (II)

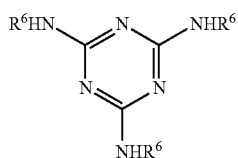
(II)

in which
$R^6$ is hydrogen,
wherein the X-ray diffractogram with a lattice constant of d=10.3 (±0.2) Å of the metal azo pigment has a signal $S_1$ with an intensity $I_1$ and in the lattice constant range from d=16.05 Å to d=11.78 Å has no signal $S_2$ whose intensity $I_2$ in relation to the intensity $I_1$ of signal $S_1$, expressed as ratio $I_2/I_1$ of the background-corrected intensities, exceeds a value of 0.02.

6. A pigment preparation comprising at least one metal azo pigment according to claim 1.

7. A pigment preparation according to claim 6, further comprising at least one dispersant.

8. A pigment preparation according to claim 6 comprising C.I. Pigment Green 36 and/or C.I. Pigment Green 58.

9. A pigment preparation according to claim 6, further comprising at least one organic compound selected from the group consisting of terpenes, terpenoids, fatty acid esters and homopolymers or copolymers having a solubility in water at 20° C. of less than 1 g/l.

10. A method for producing a pigment preparation according to claim 6, comprising mixing and grinding the at least one metal azo pigment with at least one dispersant and optionally at least one further pigment and optionally with at least one organic compound selected from the group consisting of terpenes, terpenoids, fatty acid ester and homopolymers or copolymers.

11. A method for producing a metal azo pigment according to claim 1, comprising reacting a compound of the formula (Id), or tautomers thereof,

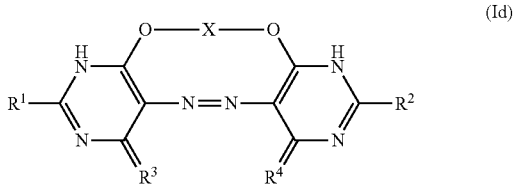
(Id)

in which
X is an alkali metal ion; and
$R^1$, $R^2$, $R^3$, $R^4$ and $R^5$ have the definition indicated in claim 1, with at least one compound of the formula (II)

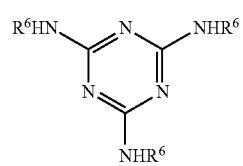
(II)

in which $R^6$ has the definition indicated in claim 1,
and with at least one nickel salt and with at least one zinc salt and optionally with at least one further metal salt selected from the group consisting of copper, aluminium, iron and cobalt salts.

12. A colour filter comprising at least one metal azo pigment according to claim 1.

13. A photoresist comprising at least one photocurable monomer, at least one photoinitiator and at least one metal azo pigment according to claim 1.

14. Method for producing colour filters for liquid crystal displays comprising at least one metal azo pigment according to claim 1, the method comprising
grinding the at least one metal azo pigment in an organic solvent, optionally with addition of a binder resin and/or dispersant;
processing the ground at least one metal azo pigment with the addition of photocurable monomers, photoreaction initiators and optionally further binder and/or solvent, to a photoresist;

applying the photoresist; and curing the photoresist and developing to give the completed coloured colour filter.

15. A liquid crystal display comprising at least one colour filter made by the method according to claim 14.

* * * * *